United States Patent
Lin et al.

(10) Patent No.: US 8,697,482 B1
(45) Date of Patent: Apr. 15, 2014

(54) METHOD FOR MANUFACTURING JUNCTION PLANE OF SOLAR CELL THROUGH ALUMINUM INDUCED CRYSTALLIZATION METHOD

(71) Applicant: National Yunlin University of Science and Technology, Douliu (TW)

(72) Inventors: Jian-Yang Lin, Douliu (TW); Ting-Jia Chen, Douliu (TW)

(73) Assignee: National Yunlin University of Science and Technology, Douliu, Yunlin County (TW)

( * ) Notice: Subject to any disclaimer, the term of this patent is extended or adjusted under 35 U.S.C. 154(b) by 0 days.

(21) Appl. No.: 13/730,021

(22) Filed: Dec. 28, 2012

(51) Int. Cl.
*H01L 21/00* (2006.01)

(52) U.S. Cl.
USPC .............................. 438/97; 438/166

(58) Field of Classification Search
USPC .............................. 438/96–98, 166
See application file for complete search history.

(56) References Cited

U.S. PATENT DOCUMENTS

| 5,275,851 A * | 1/1994 | Fonash et al. ................ 438/479 |
| 7,135,350 B1 | 11/2006 | Smith et al. |
| 7,633,006 B1 | 12/2009 | Swanson |

* cited by examiner

*Primary Examiner* — Richard Booth
(74) *Attorney, Agent, or Firm* — Muncy, Geissler, Olds & Lowe, P.C.

(57) ABSTRACT

A method for manufacturing a junction plane of a solar cell through an aluminum induced crystallization method includes steps of: providing a substrate; forming an aluminum film layer on a surface of a first growth area on a back side of the substrate; forming an N-type amorphous silicon layer on a surface of the aluminum film layer and a surface of a second growth area on the back side of the substrate; performing a thermal treatment to allow aluminum to induce the N-type amorphous silicon layer to crystallize and form a P-type polycrystalline silicon layer, such that positions of the aluminum film layer and the P-type polycrystalline silicon layer are switched due to the thermal treatment to allow the P-type polycrystalline silicon layer to be formed between the aluminum film layer and the substrate to form a PN junction plane with the N-type amorphous silicon layer.

10 Claims, 6 Drawing Sheets

METHOD FOR MANUFACTURING JUNCTION PLANE OF SOLAR CELL THROUGH ALUMINUM INDUCED CRYSTALLIZATION METHOD

FIELD OF THE INVENTION

The present invention relates to a method for manufacturing a junction plane of a solar cell, and particularly to a method for manufacturing a junction plane of a solar cell through an aluminum induced crystallization method.

BACKGROUND OF THE INVENTION

The solar cell industry is recently one of the most popular energy technology industries. In the solar cell industry, researchers and developers constantly seek for enhanced photoelectrical conversion efficiency. To prevent a light receiving surface of a solar cell from being disposed with an excessive number of elements and thus reducing an area from illumination of a light source, a backside contact solar cell is developed. In a backside contact solar cell, all electrodes are manufactured on a back side of a substrate opposite to the light receiving surface, so as to prevent reduction of illuminated area and to enhance overall photoelectric conversion efficiency.

In the U.S. Pat. No. 7,135,350 disclosing "Use of Doped Silicon Dioxide in the Fabrication of Solar Cells", silicon oxide containing impurities is utilized as a diffusion source. After depositing silicon oxide containing a first impurity, a layer of pure silicon oxide is covered thereupon. Silicon oxide containing a second impurity is then deposited thereupon after patterning, and a layer of pure silicon oxide is covered again to eventually form a PN junction plane at a back side after high-temperature diffusion. However, in the fabrication process above, two lithography etching processes are required. Thus, in addition to being suitable for only growing monocrystalline silicon, the above fabrication process also involves complicated manufacturing steps and stricter manufacturing conditions. As such, the fabrication process is quite high in cost and falls short in meeting a low cost appeal of solar cells.

In the U.S. Pat. No. 7,633,006 disclosing "Back Side Contact Solar Cell with Doped Polysilicon Regions", a first diffusion source is fabricated on a surface of a polycrystalline silicon by low pressure chemical vapor deposition (LPCVD); after the first diffusion source is covered by a patterned oxidized layer, a second diffusion source is then fabricated. After high-temperature diffusion, impurities enter the polycrystalline silicon to form a PN junction plane. The low pressure chemical vapor deposition needs to be performed under a high temperature of 600 to 700 degrees Celsius at higher costs. Further, safety concerns are also brought if the low pressure chemical vapor deposition process involves hazardous gases such as $SiH_4$ and $H_2$.

SUMMARY OF THE INVENTION

Therefore the primary object of the present invention is to overcome issues of high production cost and hazardous manufacturing processes in a conventional backside contact solar cell.

To achieve the above object, a method for manufacturing a junction plane of a solar cell through an aluminum induced crystallization method includes the following steps.

In step S1, a substrate is provided. The substrate has a front side for receiving incident light and a back side opposite to the front side. The back side of the substrate includes at least one first growth area and at least one second growth area.

In step S2, an aluminum film layer is formed. The aluminum film layer is formed on a surface of the first growth area.

In step S3, an N-type amorphous silicon layer is grown. The N-type amorphous silicon layer is formed on the aluminum film layer and a surface of the second growth area.

In step S4, a thermal treatment is performed to allow the aluminum film layer to induce the N-type amorphous silicon layer to crystallize and grow into a P-type polycrystalline silicon layer. Further, positions of the aluminum film layer and the P-type polycrystalline silicon layer are switched such that the P-type polycrystalline silicon layer is formed between the aluminum film layer and the substrate.

It is known from the above description that, by forming the P-type polycrystalline silicon through the aluminum induced crystallization method, a PN junction plane can be formed on the back side of the substrate and the N-type amorphous silicon layer. In addition to serving as an N-type junction plane, the N-type amorphous silicon layer may also serve as a passivation layer for reducing recombination of electrons and holes. Thus, the present invention is advantaged by having simple and safe manufacturing steps, low costs and high conversion efficiency.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
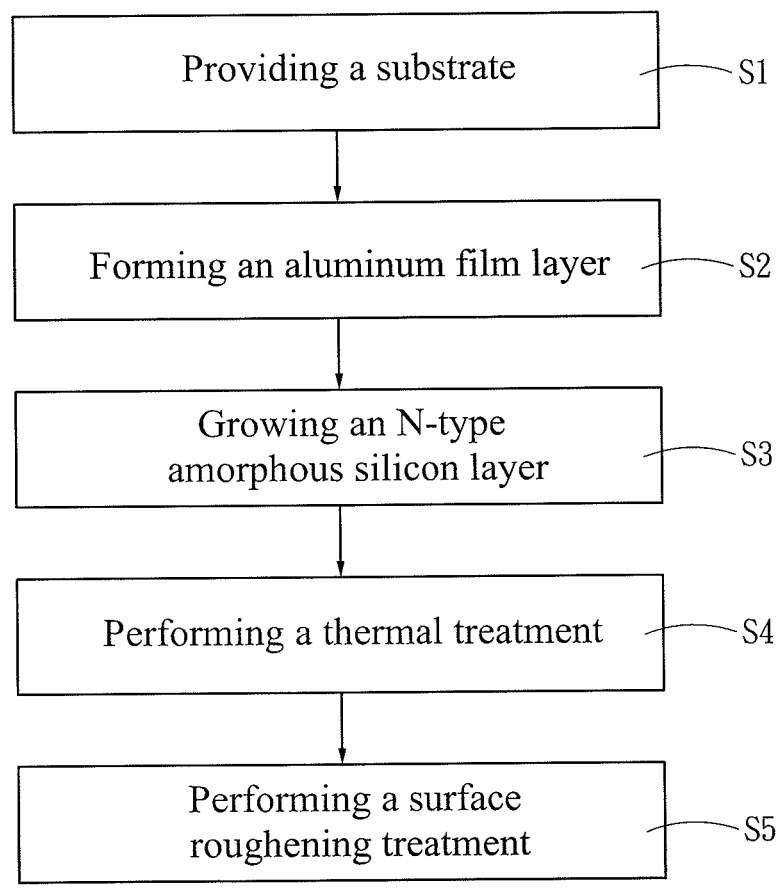
FIG. 1 is a schematic diagram of steps of a process according to a preferred embodiment of the present invention.

Referring to FIGS. 1, 2A to 2D, a method for manufacturing a junction plane of a solar cell through an aluminum induced crystallization method includes the following steps.

In step S1, a substrate 10 is provided. The substrate 10 may be an N-type substrate or a P-type substrate, and may be made of polycrystalline silicon or monocrystalline silicon. Taking an N-type substrate as an example, the substrate 10 has a thickness ranging between 50 and 250 μm, and comprises a front side 11 for receiving incident light and a back side 12 opposite to the front side 11. In other words, a solar light source to be photoelectric converted enters from the front side 11. The back side 12 of the substrate 10 includes at least one first growth area 121 and at least one second growth area 122. In this embodiment, a plurality of first growth areas 121 and a plurality of second growth areas 122 are arranged in an interlaced manner. The first growth areas 121 have a width between 50 and 2000 µm, and the second growth areas 122 have a width ranging between 200 and 3000 µm.

Figure 3:
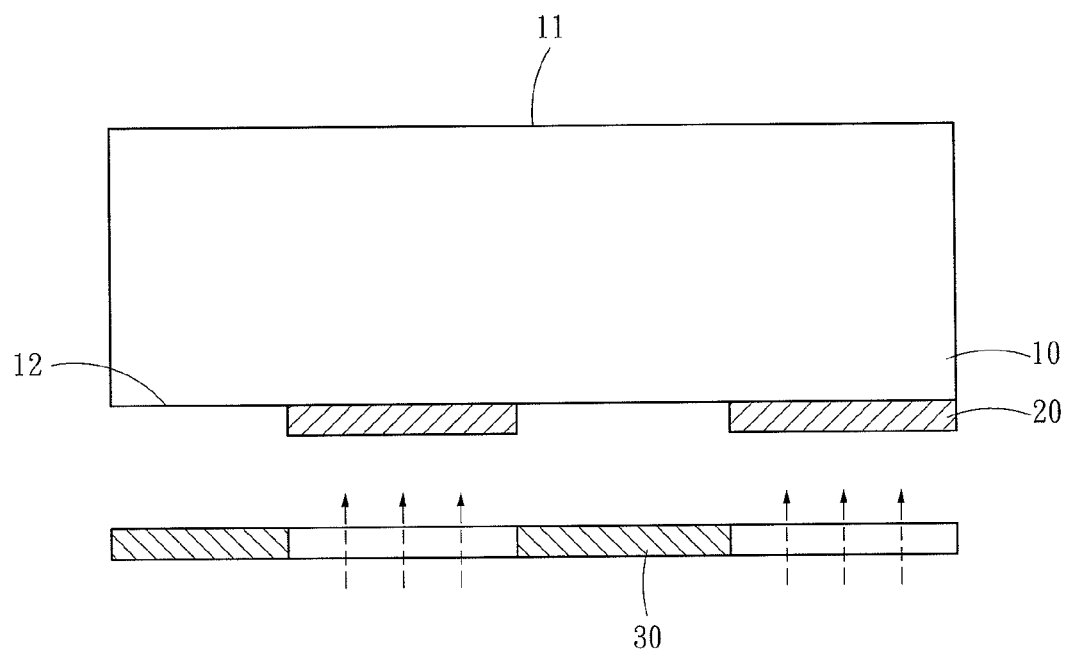
FIG. 3 is a schematic diagram of a mask process according to a preferred embodiment of the present invention.

In step S2, an aluminum film layer 20 is formed. The aluminum film layer 20, having a thickness between 10 and 10000 nm, is formed on a surface of the first growth area 121. The aluminum film layer 20 may be formed by various approaches. In one embodiment, the aluminum film layer 20 is formed by thermal evaporation or sputtering on the back side 12, and the aluminum film layer 20 located on the second growth area 122 is removed through etching by photoresist. Referring to FIG. 3, in one embodiment, a mask 30 is disposed on the surface of the second growth area 122 such that aluminum film layer 20 is allowed to be grown only on the surface of the first growth area 121. In one embodiment, a photoresist is applied to the surface of the second growth area 122, the aluminum film layer 20 is grown on the back side 12, and the aluminum film layer 20 located on the second growth area 122 is lifted off by rinsing the photoresist. In step S3, an N-type amorphous silicon layer 40 is grown.

Figure 2A:
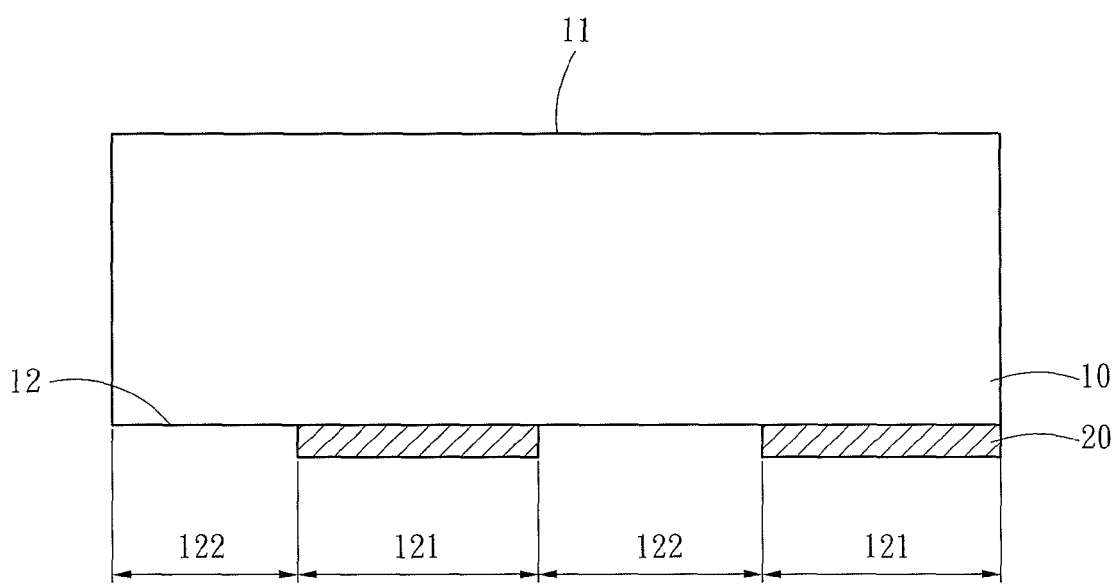
FIG. 2A is a first schematic diagram of a manufacturing method according to a preferred embodiment of the present invention.
Figure 2B:
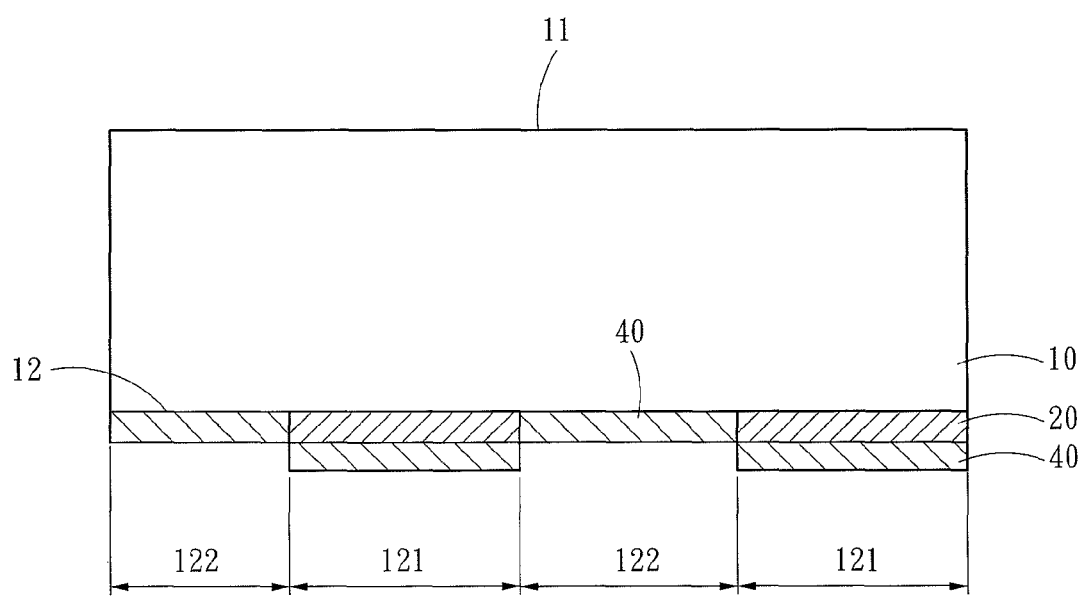
FIG. 2B is a second schematic diagram of a manufacturing method according to a preferred embodiment of the present invention.

Referring to FIG. 2B, the N-type amorphous silicon layer 40 is formed on the aluminum film layer 20 and at the surface of the second growth area 122. The N-type amorphous silicon layer 40 may be formed by hydrogenated amorphous silicon (a-Si:H) through plasma enhanced chemical vapor deposition (PECVD) on the second growth area 122 of the substrate 10 and the aluminum film layer 20. A doping concentration of N-type ions of the N-type amorphous silicon layer 40 may be between $1 \times 10^{18}$ and $5 \times 10^{19}$ per $cm^3$.

Figure 2C:
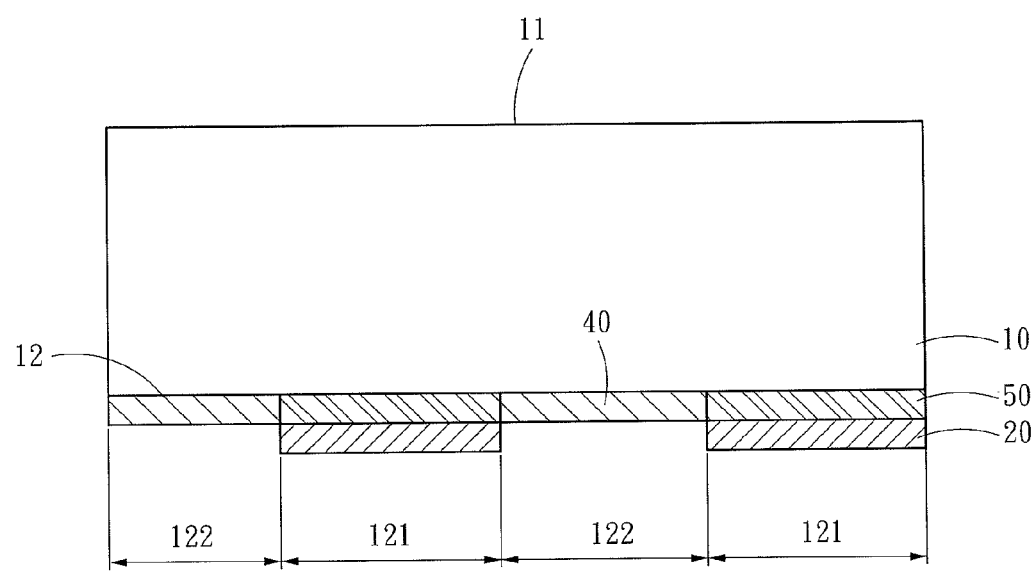
FIG. 2C is a third schematic diagram of a manufacturing method according to a preferred embodiment of the present invention.

In step S4, a thermal treatment is performed. Referring to FIG. 2C, an annealing process is utilized at a temperature between 400 and 600° C. to allow the aluminum film layer 20 to induce the N-type amorphous silicon layer 40 to crystallize and form a P-type polycrystalline silicon layer 50. Further, positions of the aluminum film layer 20 and the P-type polycrystalline silicon layer 50 are switched due to the thermal treatment, such that the P-type polycrystalline silicon layer 50 is formed between the aluminum film layer 20 and the substrate 10. Thus, the P-type polycrystalline silicon layer 50 and the N-type amorphous silicon layer 40 are respectively formed on the first growth area 121 and the second growth area 122 of the substrate 10 to be a PN junction plane as a part of a structure of the solar cell. It should be noted that, in addition to serving as an N-type semiconductor, the N-type amorphous silicon layer 40 also serves as a passivation layer for reducing a recombination speed of electrons and holes formed from the PN junction plane due to exposure to light in a subsequent conduction process. Further, the P-type polycrystalline silicon layer 50 on the plurality of first growth areas 121 and the N-type amorphous silicon layer 40 on the plurality of second growth areas 122 are spaced from one another to form cross-finger structure, thereby effectively increasing an area of the PN junction plane for enhancing photoelectric conversion efficiency.

Figure 2D:
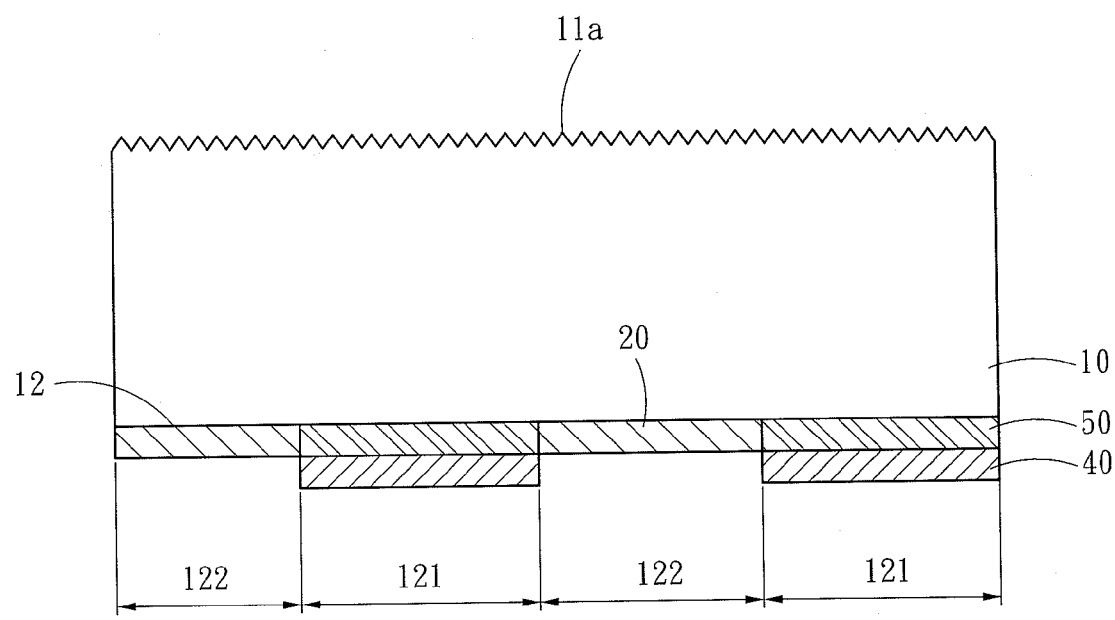
FIG. 2D is a fourth schematic diagram of a manufacturing method according to a preferred embodiment of the present invention.

In step S5, a surface roughening treatment is performed. Referring to FIG. 2D, a roughening treatment is performed on the front side 11 of the substrate 10 to form a concave and convex structure as an anti-reflective surface 11a on the front side 11 of the substrate 10. It should be noted that, step S5 is irrelevant from a sequence of the foregoing steps, and can be performed after step S1 to increase an amount of incident light.

In summary, according to the present invention, the N-type amorphous silicon layer 40 in the first growth area 121 is aluminum-induced and crystallized to form the P-type polycrystalline silicon layer 50 by use of a high-temperature annealing process, so as to form the PN junction plane on the back side 12 of the substrate 10 and the N-type amorphous silicon layer 40. In addition to serving as an N-type junction plane, the N-type amorphous silicon layer 40 further serves as a passivation layer for reducing recombination of electrons and holes. Thus, the present invention is advantaged by having simple and safe manufacturing steps, low costs and high conversion efficiency.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method for manufacturing a junction plane of a solar cell through an aluminum induced crystallization method, comprising the steps of:
    S1) providing a substrate; wherein the substrate comprises a front side for receiving incident light and a back side opposite to the front side, and wherein the back side includes at least one first growth area and at least one second growth area;
    S2) forming an aluminum film layer on a surface of the at least one first growth area;
    S3) forming an N-type amorphous silicon layer on a surface of the aluminum film layer and a surface of the at least one second growth area; and
    S4) performing a thermal treatment to allow the aluminum film layer to induce the N-type amorphous silicon layer to crystallize and grow into a P-type polycrystalline silicon layer; wherein positions of the aluminum film layer and the P-type polycrystalline silicon layer are switched due to the thermal treatment such that the P-type polycrystalline silicon layer is formed between the aluminum film layer and the substrate.

2. The method of claim 1, wherein in the step S1, the back side of the substrate includes a plurality of first growth areas and a plurality of second growth areas that are arranged in an interlaced manner.

3. The method of claim 1, wherein the at least one first growth area is formed at a width between 50 and 2000 µm, and the at least one second growth area is formed at a width between 200 and 3000 µm.

4. The method of claim 1, wherein in the step S1, the substrate is an N-type substrate.

5. The method of claim 1, after the step S1, further comprising the step of:
    S5) forming a concave and convex structure as an anti-reflective surface on the front side of the substrate.

6. The method of claim 1, wherein in the step S2, the aluminum film layer is formed on the back side of the substrate by thermal evaporation or sputtering, and the aluminum film layer formed on the at least one second growth area is removed through etching by photoresist.

7. The method of claim 1, wherein in the step S2, a mask is disposed on the surface of the at least one second growth area, such that the aluminum film layer is allowed to be grown only on the surface of the at least one first growth area.

8. The method of claim 1, wherein in the step S2, a photoresist is applied to the surface of the at least one second growth area, the aluminum film layer is grown on the back side of the substrate, and the aluminum film layer formed on the at least one second growth area is lifted off by rinsing the photoresist.

9. The method of claim 1, wherein in the step S3, the N-type amorphous silicon layer is formed by plasma enhanced chemical vapor deposition.

10. The method of claim 1, wherein in the step S3, a doping concentration of N-type ions of the N-type amorphous silicon layer is between $1\times10^{18}$ and $5\times10^{19}$ per $cm^3$.

* * * * *